United States Patent [19]
Cooper, Jr. et al.

[11] Patent Number: 5,365,477
[45] Date of Patent: Nov. 15, 1994

[54] DYNAMIC RANDOM ACCESS MEMORY DEVICE

[75] Inventors: James A. Cooper, Jr.; Michael R. Melloch; Theresa B. Stellwag, all of West Lafayette, Ind.

[73] Assignee: The United States of America as represented by the Secretary of the Navy, Washington, D.C.

[21] Appl. No.: 899,538

[22] Filed: Jun. 16, 1992

[51] Int. Cl.$^5$ ............................................. H01L 29/161
[52] U.S. Cl. ................................... 365/174; 365/149; 365/177; 365/180; 257/76; 257/110; 257/187; 257/197; 257/198
[58] Field of Search ............... 365/174, 177, 180, 186, 365/149; 257/76, 110, 183.1, 197, 198, 200, 183, 187, 192, 77, 78

[56] References Cited

U.S. PATENT DOCUMENTS

| | | | |
|---|---|---|---|
| 3,753,248 | 8/1973 | Lynes et al. | 365/177 |
| 3,876,992 | 4/1975 | Pricer | 340/173 CA |
| 3,931,617 | 2/1976 | Russell | 365/177 |
| 4,635,083 | 1/1987 | Cooper, Jr. | 257/183 |
| 4,807,008 | 2/1989 | Chang et al. | 257/197 |
| 4,933,732 | 6/1990 | Katoh et al. | 257/197 |
| 5,049,955 | 9/1991 | Freeouf et al. | 257/197 |
| 5,101,245 | 3/1992 | Shimura | 257/183 |
| 5,162,891 | 11/1992 | Burroughes et al. | 257/183 |

FOREIGN PATENT DOCUMENTS 63-158862  1/1988  Japan .................. 257/183

OTHER PUBLICATIONS

Bedair, Extremely Low-Leakage GaAs Pi-N Junctions and Memory Capacitors Grown by Atomic Layer Epitaxy, IEEE Electron Device Letters, vol. 11, No. 6, Jun. 1990.

Sander et al; "High Density Memories"; IEEE Solid-State Circuits Conference, Digest of Technical Papers, pp. 182–183, 176.

Antipov; "Proposed Process Modifications for Dynamic Bipolar Memory to Reduce Emitter-Base Leakage Current", IEEE Transactions on Electron Devices, vol. ED-27, No. 8, pp. 1649–1654, 1980.

Quinn et al; "High Density Memories"; IEEE International Solid-State Conference 1978, pp. 154–155.

Sunami, "Cell Structure for Future DRAM's", IEEE IEDM, pp. 694–697, 1985.

Cze, Nonvolatile Memory Devices, *Physics of Semiconductor Devices*, pp. 496–506, John Wiley & Sons, Inc., New York, 1981.

*Primary Examiner*—Eugene R. LaRoche
*Assistant Examiner*—Vu Le
*Attorney, Agent, or Firm*—Thomas E. McDonald; William F. McCarthy; John G. Wynn

[57] ABSTRACT

A vertically integrated DRAM cell having a storage time of at least 4.5 hours at room temperature, formed from a wide-bandgap semiconductor such as GaAs or AlGaAs, in which an n-p-n bipolar access transistor is merged with a p-n-p storage capacitor, with the middle p-n layers being common to both. Similarly, a p-n-p transistor can be merged with an n-p-n storage capacitor.

19 Claims, 6 Drawing Sheets

DYNAMIC RANDOM ACCESS MEMORY DEVICE

FIELD OF THE INVENTION

This invention generally relates to semiconductor memories and more particularly to a dynamic random access memory formed in a wide-bandgap semiconductor, each cell of which comprises a bipolar transistor and a charge storage device.

BACKGROUND OF THE INVENTION

In general, semiconductor memories may be divided into three classes: random-access memories (RAM's), read-only memories (ROM's), and programmable read-only memories (PROM's). RAM's are used to store large volumes of data which must be read and written at high speeds. ROM's may not be electrically written; they store data which may be read at high speeds but not changed by the system during operation. PROM's may be erased and reprogrammed, but only at very slow rates, so that reprogramming is not feasible during system operation. In effect, PROM's may be regarded as ROM's which may be programmed a few times by the user.

There are two important operating characteristics which describe semiconductor memories: (i) volatility, and (ii) writability. Volatility refers to the time period over which a memory will store data. A memory is said to be nonvolatile if the data is retained for a useful period of time after power is removed. Both ROM's and PROM's are nonvolatile. Writability refers to the ability of the memory to be written with new data at high speeds by the system during operation, i.e., the ability to store data which is the result of calculations performed by the system or new data to be processed by the system. In this sense, RAM's are writable, but ROM's are not.

Thus, RAM's offer writability, but not nonvolatility. ROM's are nonvolatile, but also nonwritable.

RAM's can be classified as either static RAM's or dynamic RAM's. Dynamic RAM's, or DRAM's, are widely used in modern digital computing systems for high-speed data storage and retrieval. In a DRAM, the data storage is said to be "dynamic," because data is retained only for a relatively short time, typically on the order of a few seconds at room temperature. The basic DRAM cell consists of an access transistor and a storage capacitor. Data is written into the cell by turning on the access transistor so that the potential applied to the bit line is connected directly to the storage capacitor. When the access transistor is turned off, the storage capacitor remains charged to the potential of the bit line until unwanted leakage currents slowly discharge it. See articles by Sander et al. entitled High Density Memories, Institute for Electronic and Electrical Engineers International (IEEE) Solid-State Circuits Conference, Digest of Technical Papers, pp. 182–83, 1976, and by Antipov entitled Proposed Process Modifications for Dynamic Bipolar Memory to Reduce Emitter-Base Leakage Current, IEEE Transactions on Electron Devices, Vol. ED-27, No. 8, pp. 1649–54, 1980.

The "storage time" of a DRAM cell is an important parameter of the cell. Since the data decays, the memory controller must periodically read and rewrite the contents of each cell in the array, a process referred to as "refresh." Typical refresh rates in modern systems are around 1 kilohertz (kHz), requiring storage times greater than about 20 milliseconds (ms). In spite of the system overhead imposed by the refresh requirement, DRAM's are widely used because of their simplicity and small cell size. For DRAM configurations described above, see articles by Quinn et al. entitled High Density Memories, IEEE International Solid-State Conference, 1978, and by Sunami entitled Cell Structures for Future DRAM's, IEEE IEDM, pp. 694–97, 1985. DRAM's also have the added advantage of dissipating almost no static power while storing data.

The advantages of DRAM's are best appreciated in comparison to programmable read-only memories (PROM's). PROM's are nonvolatile, but may not be electrically written during operation, that is, they do not have writability. PROM's typically store data by transferring charge to a region isolated by a large potential barrier. This region typically takes the form of a floating gate surrounded by an insulating barrier of silicon dioxide in a metal-oxide-semiconductor field-effect transistor (MOSFET) geometry. Charge is transferred to and from the floating gate by avalanche injection of electrons over or tunneling through the potential barrier of the oxide at high electric fields. Because the potential barrier is very large, leakage is negligible at normal operating temperatures, and storage is nonvolatile.

Electrical readout of the stored data in a PROM is accomplished by detecting the current in the underlying MOSFET; in effect, the floating gate shifts the threshold voltage of the MOSFET, altering the current. Reading is therefore very fast. There are a great variety of similar structures, all operating on a similar basic principle. See text in publication by Sze entitled *Nonvolatile Memory Devices*, Physics of Semiconductor Devices, pp. 496–506, John Wiley & Sons, Inc., New York, 1981. For example, some devices store charge in deep traps within a special dualdielectric insulator, rather than on an electrode. Examples are the MNOS (for metal-nitride-oxide-semiconductor) memory and the doped-interface dual-dielectric storage cell (where charge is stored on a sub-monolayer of metal atoms deposited at the dielectric interface).

Unfortunately, all PROM's suffer from two important drawbacks. First, writing data into the memory is very slow (typically one-tenth of a millisecond for each cell). Second, all these devices are subject to a "wearout" mechanism, in which the cell's operation degrades after about $10^6$–$10^7$ write operations. If the memory is only reprogrammed a few times, this wearout mechanism does not present any difficulties. Any attempt, however, to use this type of cell as a read/write memory would quickly exceed the wearout limit of the dielectric, since $10^6$ writing operations may typically take place in just a few seconds in a high-speed computing system.

In summary, there is no semiconductor memory known to the art that is both nonvolatile and writable during operation.

OBJECT AND SUMMARY OF THE INVENTION

Therefore, it is an object of the invention to provide a semiconductor memory device (1) which can be written with new data at high speed during system operation and (2) which retains data for a useful period of time, even at least several hours at room temperature, after power is removed.

It is a further object of the invention to provide such a semiconductor memory device that is not subject to cell degradation after a high number of write operations to the cell.

The DRAM device, according to the invention, includes a bit line, a charge storage device in a wide-bandgap semiconductor such as GaAs or AlGaAs and a bipolar access transistor, also formed of the wide-bandgap semiconductor, for connecting the charge storage device to the bit line. Preferably, the bipolar access transistor is vertically integrated with the charge storage device in only four semiconductor layers of alternating conductivity i.e., n-p-n-p. For example, a n-p-n bipolar access transistor may be vertically integrated with a p-n-p storage capacitor, with the floating collector of the bipolar transistor being merged with the n-region of the storage capacitor. The use of a wide-bandgap semiconductor bipolar access transistor in this DRAM device results in storage times which are several orders of magnitude greater than the best FET-accessed cells. The DRAM cell is not limited to a single wide-bandgap semiconductor. For example, the access transistor may be a heterojunction bipolar transistor (HBT) having a base region of one wide-bandgap semiconductor and collector and emitter regions of a different wide-bandgap semiconductor.

BRIEF DESCRIPTION OF THE DRAWINGS

The invention will be better understood, and further objects, features and advantages thereof will become more apparent from the following description of a preferred embodiment, taken in conjunction with the accompanying drawings, in which.

DETAILED DESCRIPTION OF THE PREFERRED EMBODIMENT

Figure 1:
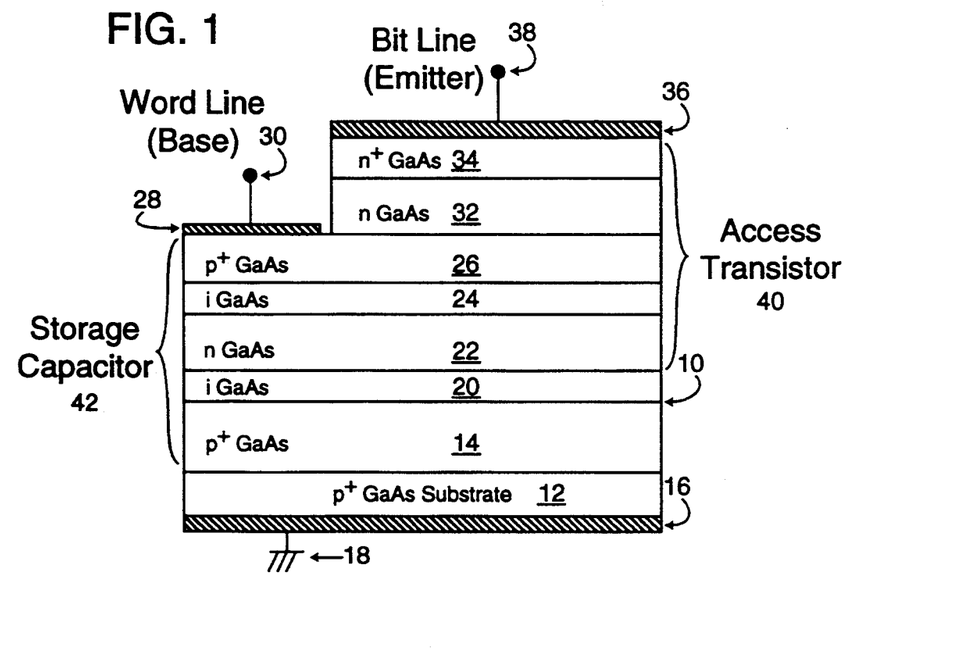
FIG. 1 is a schematic cross section of a GaAs bipolar DRAM cell, according to the invention.

Referring now to FIG. 1, the basic bipolar DRAM cell structure 10 consists of four regions of alternating doping type GaAs upon a p+-type GaAs substrate 12. A 1000 nm thick p+-type first region 14 of GaAs is formed on the substrate 12. The substrate 12 has a first ohmic contact 16 to a ground potential 18. A 30 nm thick first layer 20 of undoped GaAs is formed on the p-type first region 14 for reducing leakage currents flowing from the p-type first region 14. A 200 nm thick n-type second region 22 of GaAs is formed over the undoped layer 20 on the p-type first region 14. A 30 nm thick second layer 24 of undoped GaAs is formed on the n-type second region 22 also for reducing leakage currents flowing from the second region 22. A 100 nm thick p+-type third region 26 of GaAs is then formed on the second layer 24 of undoped GaAs. This third region 26 has a second ohmic contact 28 connected to a word line 30 of an array of memory cells. A 200 nm thick n-type fourth region 32 of GaAs is formed on the third region 26. A heavily doped N+ GaAs cap layer 34 formed on the fourth region 32 has a third ohmic contact 36 connected to a bit line 38 of the array of memory cells. The p+-type regions 12, 14 and 26 are doped with beryllium to a concentration of approximately $1 \times 10^{19} \, cm^{-3}$. The n GaAs regions 22 and 32 are doped with silicon to a concentration of approximately $5 \times 10^{17} \, cm^{-3}$.

Figure 2:
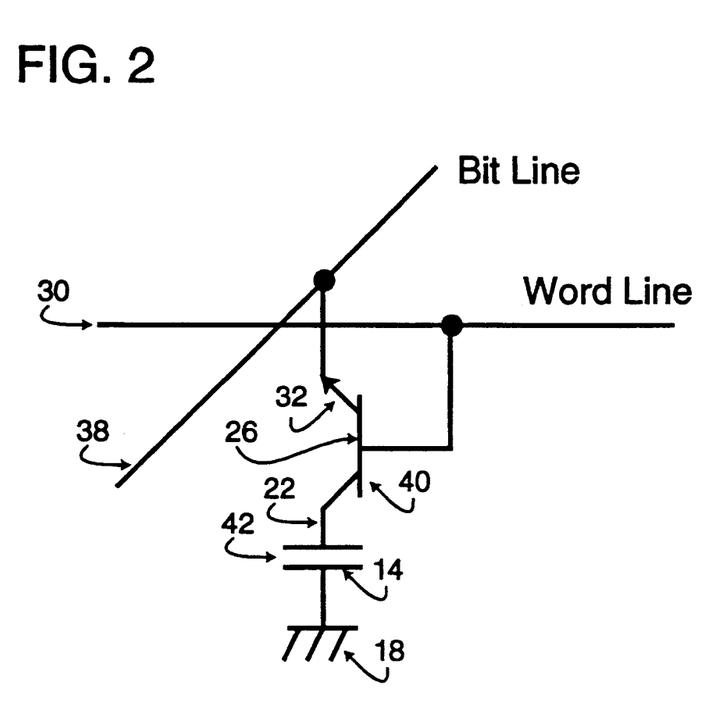
FIG. 2 is an electrical schematic of the bipolar DRAM cell of FIG. 1.
Figure 3A:
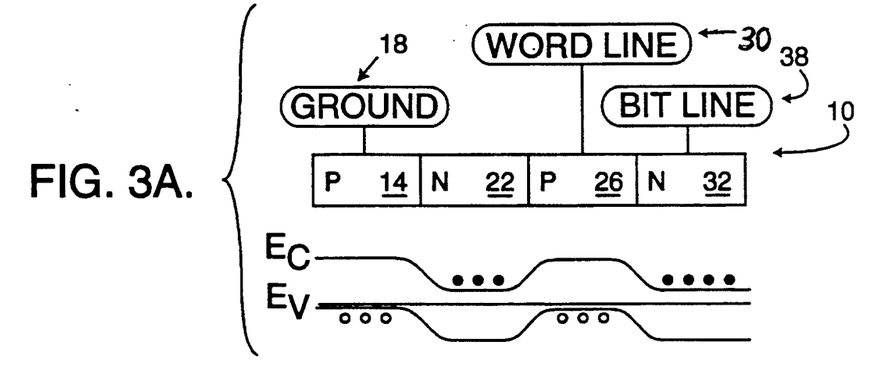
FIGS. 3(a)–3(d) schematically illustrate the band diagrams of the n-p-n bipolar DRAM cell according to the present invention.
Figure 3B:
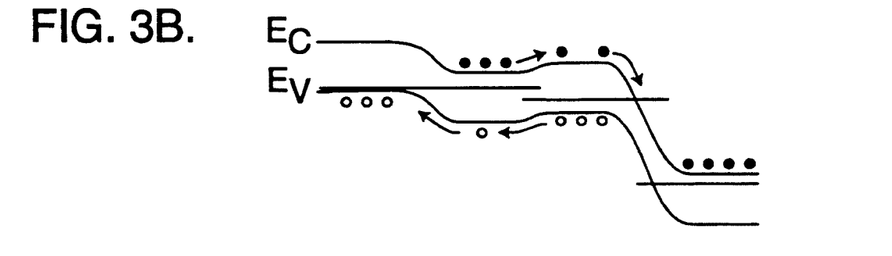
Figure 3C:
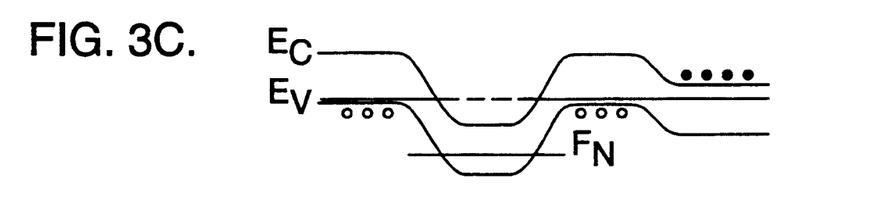
Figure 3D:
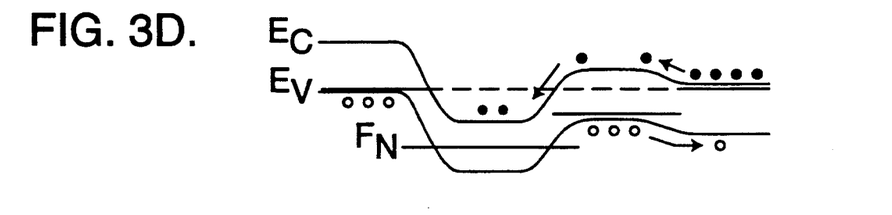

As can be noted in FIG. 2, the three regions 22, 26, and 32 form an n-p-n bipolar access transistor 40, with the n GaAs fourth region 32 defining a transistor emitter region connected to the bit line 38, the p GaAs third region 26 defining a transistor base region connected to the word line 30, and the n GaAs second region 22 defining a floating transistor collector region. The three regions 14, 22 and 26 form a p-n-p storage capacitor 42 which is vertically integrated with the n-p-n bipolar access transistor 40.

The n-type region 22 constitutes both the floating collector region of the access transistor 40 and the n-type region of the storage capacitor 42. The p+-type substrate 12 serves as the ground plate of the storage capacitor 42.

The operation of the bipolar DRAM cell 10 may be understood with reference to the band diagrams of FIG. 3. In equilibrium, the Fermi level is flat across the four region structure 10, as shown in FIG. 3(a). To remove electrons from the n-type floating collector region 22, FIG. 3(b), the base region 26 and the emitter region 32 are taken positive, forward-biasing the collector-base junction and causing electrons to diffuse across the base region 26 into the emitter region 32. There is no steady state current flow, since the n-type floating collector region 22 is isolated by the reverse-biased diode to the p-type first region 14. As a result, electrons flow from the floating collector region 22 only until the collector reaches the positive potential of the word line 30. At this point, the collector-base junction is no longer forward biased, and writing is complete.

When the base region 26 and the emitter region 32 are returned to ground, FIG. 3 (c), the floating collector region 22 remains at a positive potential, and is effectively reverse-biased with respect to the p-regions 14, 26 on either side, which are both at ground potential. The floating collector region 22 remains at a positive potential until thermal generation of electron-hole pairs in the depletion regions of the reverse-biased junctions gradually replenish the electrons which were removed. This process is very slow in a wide-bandgap semiconductor such as GaAs. To reinsert electrons, the base region 26 (connected to the word line 30, is taken slightly positive, forward biasing the emitter-base junction and allowing electrons to diffuse across the base region 26 to the floating collector region 22, as shown in FIG. 3 (d).

The bipolar DRAM cell 10 stores data when both the word line 30 and the bit line 38 are at ground potential (parts (a) and (c) of FIG. 3). The implication of this fact is that data is stored with no voltage applied to the semiconductor memory device. As a result, this type of memory is considered nonvolatile to temporary power interruptions, provided these interruptions are short compared to the normal storage time of the cell.

A number of different sized, vertically integrated GaAs bipolar DRAM cells 10 were fabricated and tested to determine the room temperature storage time and the storage time as a function of temperature. The structure of FIG. 1 was fabricated on epitaxial layers grown in a Varian GEN-II molecular beam epitaxy system, with the doping densities and layer thicknesses given above.

A four-level non-self-aligned process was used to define discrete DRAM cells 10 with dimensions ranging from 36×48 to 90 ×120 μm². The emitter 32 was defined by wet chemical etching, and was contacted by thermally evaporating AuGe and alloying at 370° C. for 90 seconds to form the contact 36. In order to avoid damage during testing, a 200-nm overlayer of Au was evaporated following the anneal. This Au also served as the nonalloyed ohmic contact 28 to the p+-base region 26. The devices were completed with a mesa-isolation etch to a depth of 300 nm.

Experimental Results. For these experiments, the charge state of the bipolar DRAM 10 is determined by monitoring the capacitance between the p+-base 26 and the p-type substrate 12. When the n-type floating collector 22 is at zero bias with respect to the substrate 12, a high capacitance is measured. This state represents a logic zero. A logic one is written to the cell 10 when a positive bias is simultaneously applied to the bit line 38 and the word line 30. At this instant, a positive bias is developed across the base-collector junction allowing electrons to flow from the n-type floating collector 22 to the bit-line contact 36. This action charges the n-region 22 to a positive potential with respect to the substrate 12, thereby causing the collector-substrate p+-n junction to become reverse biased and the measured capacitance to drop. When the word line 30 is returned to ground potential, the only source of electrons to return the floating collector 22 to equilibrium are those supplied by thermal generation. This recovery process is monitored by observing the capacitance transient following the turn-off of the access transistor 40.

Figure 4:
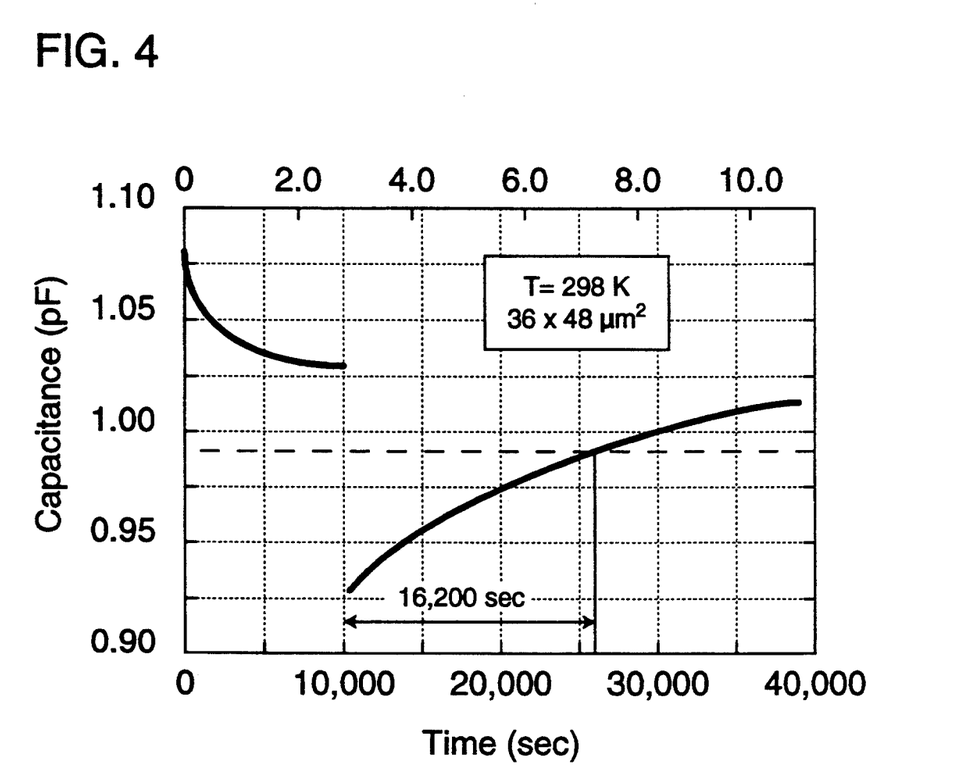
FIG. 4 is a graph of capacitance versus time showing the charge storage transient of the bipolar DRAM cell of FIG. 1 at room temperature (298° K.)

The room-temperature capacitance transient of a 36×48-um² bipolar DRAM cell 10 is shown in FIG. 4. Initially, no bias is applied to the bit line 38 and the word line 30. In order to assure that the floating collector 22 is at zero bias with respect to the substrate 12, for time t<0 the cell 10 is exposed to light, causing the p+-n junctions of the storage node 42 to become slightly forward biased. At time t=0, the light is removed and the recombination of excess carriers returns the cell 10 to its zero-bias equilibrium value. After 10,000 seconds, a positive pulse is applied to the bit line 38 and the word line 30 causing a sharp decrease in the capacitance of the cell 10. When the bias is removed 600 seconds later, an exponential capacitance recovery is observed. The storage time of a cell is defined as the time required for the capacitance to return to within 1/e of its equilibrium value. Using this definition, the room temperature storage time of this bipolar DRAM cell is approximately 16,200 seconds or 4.5 hours.

Figure 5:
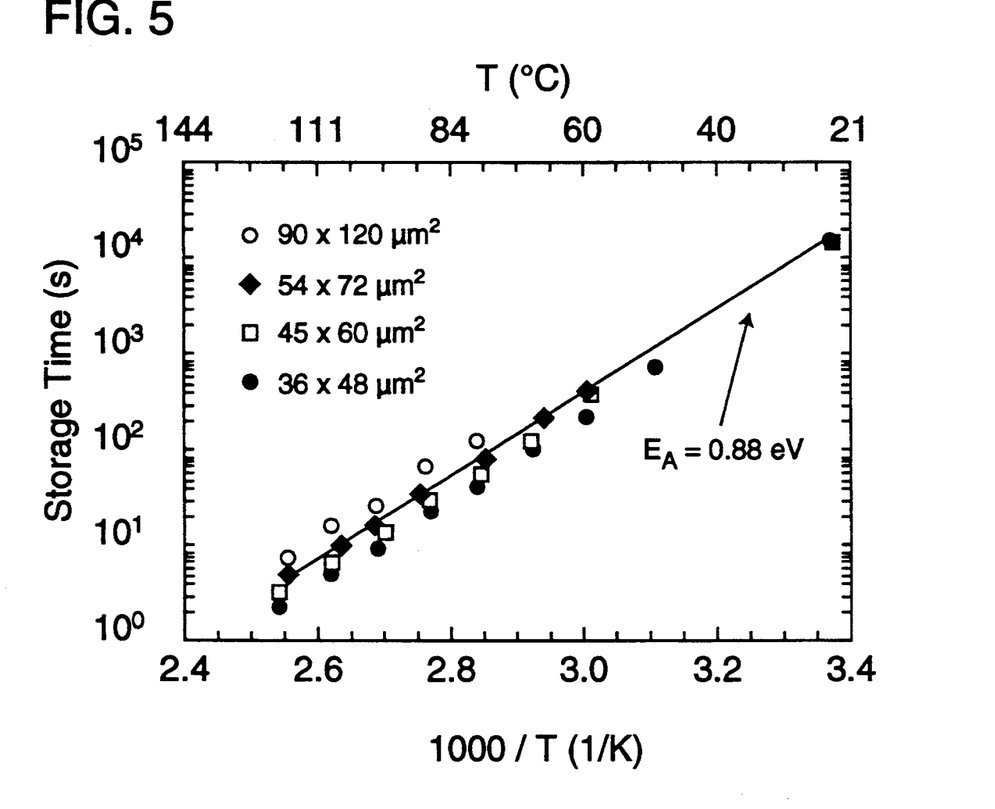
FIG. 5 is a graph showing storage time as a function of temperature for several different GaAs bipolar DRAM cells.

Plots of storage time versus temperature for complete bipolar DRAM cells 10 with various perimeter-to-area ratios are shown in FIG. 5. An activation energy $E_A$ for the generation process can be determined from an exponential fit to this experimental data using $$\tau_s = C_1 \exp(E_A/k_B T) \quad (1)$$

where $C_1$ is a proportionality constant, $k_B$ is the Boltzmann constant, and T is the absolute temperature. For the 54×72-μm² cell, $E_A$=0.88 eV. The larger (90×120 μm²) cell has a lower activation energy, while the smaller cells have activation energies greater than 0.88 eV. This variation is expected because the storage time is comprised of components due to bulk and perimeter generation. In particular, $$\frac{1}{\tau_s} = C_2 \left( G_B + G_P \frac{P}{A} \right) \quad (2)$$

where $C_2$ is a proportionality constant, $G_B$ is the bulk generation rate, $G_p$ is the perimeter generation rate, P is the perimeter, and A is the area of the cell. By combining (1) and (2), the bulk and perimeter activation energies can be separated. For these DRAM cells 10, $E_{A,Bulk}$=0.7 eV while $E_{A,Perimeter}$=1.0 eV. Therefore, as cell size decreases, the effective activation energy tends towards that of the perimeter. At room temperature all four cells have storage times of approximately 4.5 hours. In digital circuits where a minimum storage time of 100 ms is specified, these bipolar DRAM cells 10 could be used in applications where the operating temperature exceeds 130° C.

$Al_{0.4}Ga_{0.6}As$ DRAM p-n-p storage capacitors, similar to the GaAs DRAM storage capacitors 42, have been fabricated and tested, as described above, to determine their storage time. The room temperature storage time of these $Al_{0.4}Ga_{0.6}As$ storage capacitors is 8 hours, significantly longer than that of the GaAs storage capacitors 42. This result was expected, since the bandgap of $Al_{0.4}Ga_{0.6}As$ is approximately 1.9 eV, much higher than the 1.42 eV bandgap of GaAs or the 1.12 eV bandgap of silicon.

Figure 6:
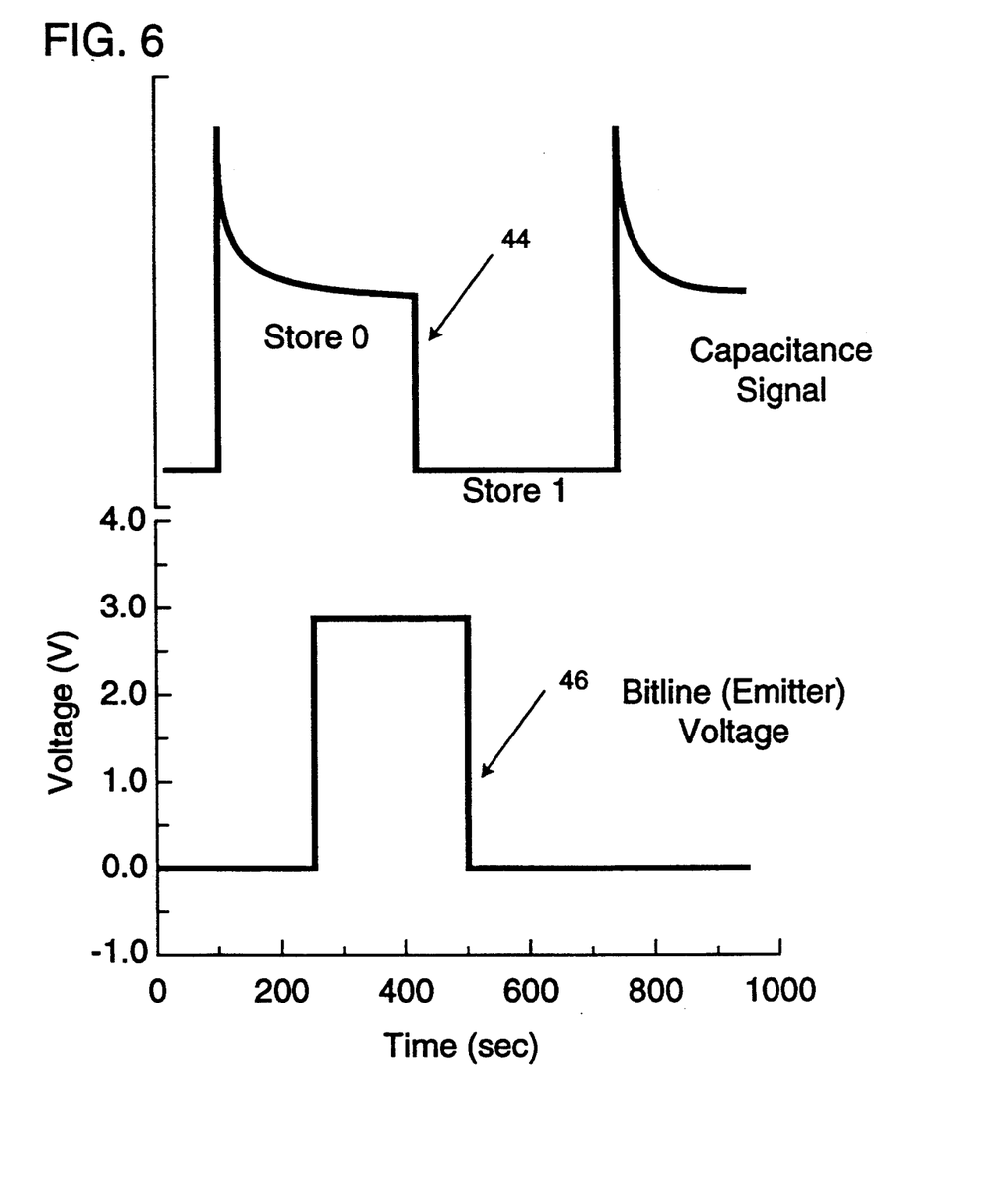
FIG. 6 is a graph demonstrating the electrical writing of the bipolar DRAM cell, in which the top waveform is the room-temperature base capacitance and the bottom waveform is the bit line (emitter) voltage.

Writing the value of the bit line 38 into a cell 10 through the access transistor 40 is demonstrated in FIG. 6. The top waveform 44 is the room-temperature capacitance of the cell measured between the word-line (base) contact 28 and substrate contact 16 and the bottom waveform 46 is the voltage applied to the bit-line (emitter) contact 36. On this time scale, 100 seconds per division, the short 1-ms word-line pulses could not be captured readily on a digitizing oscilloscope and are not shown in this figure. Instead, it should be noted that the 3-V, 1-ms word-line pulses occur when there is an abrupt change in the capacitance signal 44. The data on the bit line 38 are written into the cell 10 during each 1-ms pulse applied to the base 26 of the transistor 40. Initially, a logic one is stored in the DRAM cell 10 and a low capacitance is measured. During the first pulse, the bit-line voltage is low and the capacitance rises, indicating that the cell 10 has returned to its zero-bias equilibrium state. As described previously, the capacitance decay is due to the turn-off time of the forward-biased base-collector p+-n junction. Likewise, during the second word-line pulse, the bit-line voltage is high and the capacitance falls, indicating charge has been removed from the storage capacitor 42. This lower capacitance value represents the nonequilibrium state of the cell 10 and will rise exponentially with a time constant of about 4.5 hours. This rise is imperceptible on the time scale of these waveforms.

The stored information has been read electrically by monitoring the bit-line voltage with a low-capacitance active probe. The bit-line voltage excursions during a read one and a read zero differ by approximately 250 mV. In an integrated circuit application, this voltage difference would be detected by sense amplifiers and latched for data readout.

In addition to increased storage times over FET-accessed cells, the bipolar design has several other distinct advantages. First, since no applied bias is required during the store state and there are no measurable leakage currents, the bipolar cell 10 has zero static power dissipation and could be used as a short-term nonvolatile memory. Moreover, the access times of bipolar cells should be shorter than those of FET-accessed DRAM's because charge is removed vertically rather than laterally. Finally, since the storage capacitor 42 is vertically integrated with the bipolar access transistor 40, no additional area is needed for the access transistor 40. Consequently, a complete DRAM cell 10 capable of storing approximately one million electrons with a 1-V reverse bias could be fabricated in an area as small as $5 \times 5$ $\mu m^2$.

It is understood by those having skilled in the art that the bipolar DRAM cell configuration of the present invention may be used to fabricate a master cell for reproduction, multiple cells, or an array of cells for a single or multiple memory device.

There are many changes, modifications, and additions to the invention which would be obvious to one skilled in the art. Therefore, it is intended that the scope of the invention be limited only by the appended claims.

What is claimed and desired to be secured by Letters Patent of the United States is:

1. A dynamic random access memory (DRAM) device with extended memory storage time, said DRAM device comprising:
    a bit line for writing information to storage when a potential is applied thereto;
    means for storing charge; and
    a bipolar transistor for connecting said charge storing means to said bit line, said bipolar transistor being formed in a semiconductor having a bandgap greater than the bandgap of silicon and said transistor having a base region, an emitter region connected to said bit line, and a floating collector region:
    wherein said DRAM device is generation limited i.e., a charge is stored by creating a deficit of carriers in the floating collector region, the storage time being determined by the rate at which carriers are created again in the collector region by thermal generation.

2. A DRAM device according to claim 1 wherein said semiconductor comprises gallium arsenide.

3. A DRAM device according to claim 1 wherein said semiconductor comprises aluminum-gallium-arsenide.

4. A DRAM device according to claim 1 further comprising a word line connected to said transistor for addressing bit line data from said bit line, wherein said bit line data comprise a first voltage or a second voltage for respectively defining a logic one or logic zero.

5. A dynamic random access memory (DRAM) cell with extended memory storage time, which comprises:
    a bipolar transistor formed in a semiconductor having a bandgap greater than the bandgap of silicon, said transistor having a base region, an emitter region, and a floating collector region;
    a charge storage device formed in said semiconductor and electrically connected to said floating collector region of said bipolar transistor;
    a bit line connected to said emitter region of said bipolar transistor for writing data to and reading data from said DRAM cell; and
    a word line connected to said base region of said bipolar transistor for addressing bit line data from said bit line;
    wherein said DRAM cell is generation limited, i.e., a charge is stored by creating a deficit of carriers in the floating collector region, the storage time being determined by the rate at which carriers are created again in the collector region by thermal generation.

6. A DRAM device according to claim 5 wherein said semiconductor comprises GaAs.

7. A DRAM device according to claim 5 wherein said semiconductor comprises AlGaAs.

8. A dynamic random access memory (DRAM) cell which comprises:
    a substrate defining a ground plate of a storage capacitor;
    a first region of semiconductor material having a bandgap greater than the bandgap of silicon and having a first conductivity type;
    a second region of semiconductor material having a bandgap greater than the bandgap of silicon and having an opposite conductivity type from said first region, said second region being disposed on said first region and defining a floating collector region of a bipolar transistor;
    a third region of semiconductor material having a bandgap greater than the bandgap of silicon and having the same conductivity type as said first region, said third region being disposed on said second region and defining a base region of said transistor; and
    a fourth region of semiconductor material having a bandgap greater than the bandgap of silicon and having the same conductivity type as said second region, said fourth region being disposed on said third region and defining an emitter region of said transistor;
    wherein said first, second and third regions form said storage capacity, and said second, third, and fourth regions form said bipolar access transistor; and
    wherein said DRAM cell is generation limited i.e., a charge is stored by creating a deficit of carriers in the floating collector region, the storage time being determined by the rate at which carriers are created again in the collector region by thermal generation.

9. A DRAM cell according to claim 8, further comprising ohmic contacts to said base region and said emitter region, respectively, for biasing said bipolar transistor.

10. A dynamic random access memory (DRAM) cell which comprises:
    a substrate defining a ground plate of a storage capacitor;
    a first region of semiconductor material having a bandgap greater than the bandgap of silicon and having a first conductivity type;
    a second region of semiconductor material having a bandgap greater than the bandgap of silicon and having an opposite conductivity type from said first region, said second region being disposed on said first region and defining a floating collector region of a bipolar transistor;
    a third region of semiconductor material having a bandgap greater than the bandgap of silicon and having the same conductivity type as said first region, said third region being disposed on said second region and defining a base region of said transistor; and a fourth region of semiconductor material having a bandgap greater than the bandgap of silicon and having the same conductivity type as said second region, said fourth region being disposed on said third region and defining an emitter region of said transistor;

wherein said first, second and third regions form said storage capacitor, and said second, third and fourth regions form said bipolar access transistor; and wherein said bipolar transistor switches said cell between high and low voltage memory configurations, and whereby a forward bias applied from said base region to said floating collector region will encourage a flow of carriers from said floating collector region to said base region so that said storage capacitor will be charged and will retain stored charge when such bias is removed.

11. A DRAM cell, according to claim 10, wherein said regions of semiconductor material comprise GaAs.

12. A DRAM cell, according to claim 10, wherein said regions of semiconductor material comprises AlGaAs.

13. A DRAM cell, according to claim 11, further comprising an undoped GaAs layer between said first region and said second region.

14. A DRAM cell, according to claim 10, wherein said first conductivity type comprises p-type GaAs and said second conductivity type comprises n-type GaAs.

15. A DRAM cell, according to claim 10, wherein said first conductivity type comprises n-type GaAs and said second conductivity type comprises p-type GaAs.

16. A DRAM cell, according to claim 12, further comprising an undoped GaAs layer between said second region and said third region.

17. A DRAM cell according to claim 8 further comprising:

a bit line connected to said emitter region of said bipolar transistor for writing data to and reading data from said DRAM cell; and a word line connected to said base region of said bipolar transistor for addressing bit line data from said bit line;

wherein said bit line data comprise a first voltage or a second voltage for respectively defining a logic one or logic zero.

18. A method of storing bit or word data in nonvolatile fashion in a random access memory (RAM) cell, the method comprising:

removing carriers from a first conductivity type region of a wide-bandgap semiconductor defining a floating collector region of a bipolar transistor by taking a second conductivity type region of said wide-bandgap semiconductor defining a base region and a first conductivity type region of said wide-bandgap semiconductor defining an emitter region to potentials other than ground to read or write said bit or word data;

returning said base region and said emitter region to ground to store said word or bit data, and wherein a wide-bandgap of said wide-bandgap semiconductor prevents said removed carriers from refilling said floating collector region; and taking said base region to a potential other than ground to encourage carriers to diffuse across said base region to said floating collector region to read or write said bit or word data.

19. A method of storing bit or word data in nonvolatile fashion in a RAM cell according to claim 18 wherein said wide-bandgap semiconductor comprises a semiconductor with a bandgap greater than the bandgap of silicon.

* * * * *